United States Patent
Casey et al.

(10) Patent No.: US 6,177,184 B1
(45) Date of Patent: Jan. 23, 2001

(54) METHOD OF MAKING AN INTERFACE LAYER FOR STACKED LAMINATION SIZING AND SINTERING

(75) Inventors: Jon A. Casey, Poughkeepsie, NY (US); Michael A. Cohn, Ramsey, NJ (US); Michael E. Cropp, La Grangeville, NY (US); Candace A. Sullivan; Robert J. Sullivan, both of Pleasant Valley, NY (US); Andrew H. Vogel, Hopewell Junction, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/133,749

(22) Filed: Aug. 13, 1998

Related U.S. Application Data

(62) Division of application No. 08/727,097, filed on Oct. 8, 1996, now Pat. No. 5,800,761.

(51) Int. Cl.$^7$ ............................................. B23B 7/00
(52) U.S. Cl. .................. 428/323; 428/408; 428/500; 428/524; 428/704
(58) Field of Search ................................ 428/408, 323, 428/704, 500, 524

(56) References Cited

U.S. PATENT DOCUMENTS

| | | |
|---|---|---|
| 2,880,147 | 3/1959 | Cunningham . |
| 2,959,978 | 11/1960 | Boutwell . |
| 4,353,958 | 10/1982 | Kita et al. . |
| 4,518,736 * | 5/1985 | Jahn ........................................ 524/404 |
| 4,920,640 * | 5/1990 | Enloe et al. ............................ 29/852 |
| 5,387,474 * | 2/1995 | Mikeska et al. ....................... 428/698 |
| 5,660,781 | 8/1997 | Moriya et al. . |
| 5,800,761 | 9/1998 | Casey . |
| 5,876,536 * | 3/1999 | Kumar et al. ......................... 428/210 |

OTHER PUBLICATIONS

CA 108:209086, Nakajima et al "Slurries for casing Boron Nitride powder", Feb. 26 1988.

CA 121:16191, Matsuhisa et al "Method and apparatus for the manufacture of ceramics injection molding", Aug. 24 1993.

* cited by examiner

*Primary Examiner*—Archene Turner
(74) *Attorney, Agent, or Firm*—DeLio & Peterson, LLC; Peter W. Peterson; Ira D. Blecker

(57) ABSTRACT

An interface layer for separating first and second microelectronic ceramic substrates during firing includes a thermally degradable binder, preferably a polymer, that degrades at temperatures above room temperature and below a firing temperature for the microelectronic ceramic substrates, and a separating material, such as boron nitride or graphite. The method of making the interface layer includes mixing the binder, one or more solvents for the binder, a plasticizer and the separating material for a sufficient period of time to form a homogeneous mass, then casting the material in a thin sheet to form the interface layer.

12 Claims, 1 Drawing Sheet

METHOD OF MAKING AN INTERFACE LAYER FOR STACKED LAMINATION SIZING AND SINTERING

This is a divisional of application(s) Ser. No. 08,727,097 filed on Oct. 8, 1996, now U.S. Pat. No. 5,800,761.

BACKGROUND OF THE INVENTION

1. Field of the Invention

This invention relates to a method of simultaneously making multiple microelectronic ceramic substrates by stacking the substrates prior to firing with an intervening thermally degradable interface layer, and to a method of making the interface layer. The invention also relates to the microelectronic ceramic substrates and to the interface layers made by the methods of the invention.

2. Description of Related Art

In the ceramic electronic industry, multilayer ceramic (MLC) technology is typically used to create three-dimensional circuitry in ceramic substrates for microelectronic devices such as integrated circuits and ceramic capacitors. The three-dimensional circuitry in the ceramic substrate is made by applying a conductive material in a circuit pattern on a ceramic/polymer composite sheet. The ceramic/polymer composite sheet is known as a "green sheet" and may have a number of via holes punched in it to allow vertical connection between the conductive material on adjacent sheets. The green sheets are stacked in a designated order and laminated together under appropriate heat and pressure to form a laminate which can be handled as a unified structure.

To produce the final ceramic material, the laminated ceramic/polymer composite is fired. The firing includes heating to remove the polymer, followed by heating to a higher temperature to sinter and densify the ceramic.

The laminate may make up a single large electronic component, but more often, it is a repetition of multiple components located adjacent to one another which need to be cut apart into individual substrates for subsequent use. This cutting may be done in the unfired stated, in the fired state or at some point therebetween.

Cutting laminates in the unfired state is the easiest, based on a criteria of laminate hardness, However, debris is generated during the cutting which will remain on the fired units. This debris is detrimental to electrical conductivity and may result in defective substrates.

Cutting laminates in the fired state can eliminate the debris problem, but the ceramic is now very hard and cutting efficiency is greatly reduced. An alternative method is to partially cut the laminate when unfired. This produces less debris. After firing, the laminate can be broken in a controlled manner along the partial cuts. However, this method also has disadvantages because of the debris generated prior to firing and the fracturing and cracking that occurs during the breaking process.

It would be desirable to provide some method of protecting the surface of the substrates against debris contamination so that cutting could be done in the unfired state. It would also be desirable to provide some means of allowing the individual substrates to be completely cut apart prior to firing, to avoid the disadvantages of fracturing when breaking them apart, while still holding the substrates together as a unitary structure prior to firing for convenient handling of the laminate.

The number of individual units produced by the methods described above is limited by the physical size of the laminate that can be produced. For a fixed maximum laminate size, more individual units can be produced if they are smaller. Given a fixed laminate size and fixed cycle times for the ceramic sintering process the output of relatively large individual units is low.

Bearing in mind the problems and deficiencies of the prior art, it is therefore an object of the present invention to provide a method of increasing the number of units which can be produced during each firing cycle.

It is another object of the present invention to reduce the problems resulting from debris contamination.

A further object of the present invention is to eliminate or reduce the problems with fractured surfaces when partially cut laminates are broken apart after firing.

Still other objects and advantages of the invention will be in part obvious and in part apparent from the specification.

SUMMARY OF THE INVENTION

The above and other objects and advantages, which will be apparent to those skilled in the art, are achieved in the present invention which is directed to, in a first aspect, a process for making multiple microelectronic ceramic substrates in which a thermally degradable interface layer is used to separate the substrates during firing. In a second aspect, the present invention is directed to the microelectronic ceramic substrates made according to the process of the invention. In other aspects, the invention is directed to the interface layer and to the method of making the interface layer used with the process of making the substrates.

In the process for making multiple microelectronic ceramic substrates, first and second pluralities of green sheets are stacked with a thermally degradable interface layer between them. The stack is then laminated, preferably under heat and pressure, to form a laminate suitable for subsequent handling. The laminate is then fired to degrade the interface layer and sinter the first and second pluralities of green sheets, thereby forming individual ceramic substrates. With a single interface layer separating two layers of green sheets, two layers of substrates are simultaneously fired, resulting in twice the rate of output.

The thermally degradable interface layer preferably includes a thermally degradable binder and a separating material. Most preferably, the thermally degradable binder is a polymer, such as ethylcellulose or methylcellulose, and the separating material is an inorganic material, such as boron nitride or graphite.

In one aspect, the process includes firing the laminate to an initial low temperature to degrade the interface layer and then raising the temperature to a higher temperature to sinter the first and second pluralities of green sheets and degrade the separating material.

To degrade the interface layer completely, it is desirable to fire the laminate in a reducing atmosphere, such as hydrogen or cracked ammonia. The process may include cutting the laminate fully apart, prior to firing, or providing a second thermally degradable interface layer below the first and second pluralities of green sheets. The laminate may then be partially cut prior to the step of firing by cutting through the first plurality of green sheets, cutting through the first interface layer and cutting through the second plurality of green sheets, but only partially cutting through the second interface layer. This allows the laminate to be handled as an integral unit prior to firing. During firing, the individual ceramic substrates are released and become fully separated as the second interface layer degrades, avoiding the necessity for breaking them apart.

The principal components of the interface layer of the present invention are a binder and a separating material. The binder is a material, such as ethylcellulose or methylcellulose, that thermally degrades at a temperature above room temperature and below the firing temperature for the microelectronic ceramic substrates being made.

The separating material is preferably a material, such as an inorganic, that acts to separate the first and second microelectronic ceramic substrates during firing, but which does not bind with them or detrimentally affect them at the sintering temperature of the green sheets forming the substrate.

The binder and the separating material are formed into a sheet for lamination between the green sheets which are to become the microelectronic ceramic substrates after firing.

In the preferred method of making the interface layer of the present invention, the separating material is mixed with a sufficient quantity of the binder and a solvent to bind the separating material. Mixing proceeds until a homogeneous mass has been formed, which is then cast in sheet form on a carrier to form the interface layer.

In the preferred method, the binder is ethylcellulose or methylcellulose and the solvent is a mixture of methanol and methyl isobutyl ketone. A plasticizer, such as dipropylene glycol dibenzoate, is also added, and the combination of binder, solvents and plasticizer is thoroughly mixed before adding the separating material.

The separating material, such as boron nitride or graphite, is then added, and final mixing occurs. The final mixture is then cast to a thickness of 50 to 100 micrometers to form the interface layer.

BRIEF DESCRIPTION OF THE DRAWINGS

The features of the invention that are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
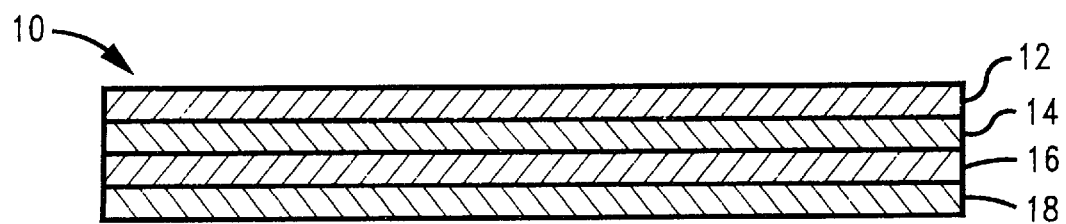
FIG. 1 is a cross-sectional side view of a laminated stack of green sheets prepared according to the prior art.

In describing the preferred embodiment of the present invention, reference will be made herein to FIGS. 1–3 of the drawings in which like numerals refer to like features of the invention. Features of the invention are not necessarily shown to scale in the drawings.

FIG. 1 shows a prior art laminate 10 used in the manufacture of microelectronic ceramic substrates. The laminate is composed of four green sheets 12, 14, 16 and 18 which are typically compressed under heat and pressure to form a unitary structure of the type illustrated. The laminate may be fired first and then cut apart into individual substrates, or more commonly, it may be cut apart into individual pieces first, and the individual pieces may then be fired to form the desired ceramic substrates. As described above, debris contamination and the limited number of pieces produced during firing are substantial problems which are addressed by the present invention.

Figure 2:
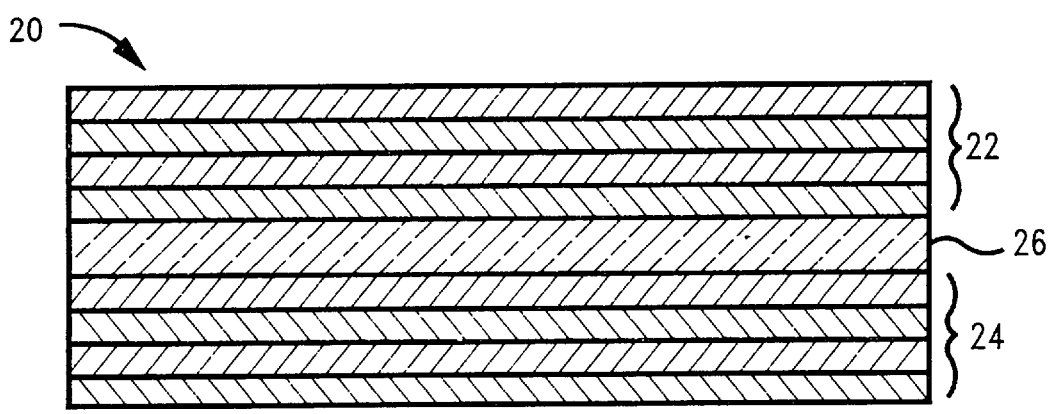
FIG. 2 is a cross-sectional side view of two laminated stacks of green sheets separated by an interface layer according to the present invention.

Microelectronic Ceramic Substrates and Method of Making the Same Using a Thermally Degradable Interface Layer FIG. 2 illustrates a laminate 20 prepared according to the present invention. The laminate 20 comprises a first stack of green sheets 22 and a second stack of green sheets 24 separated by a thermally degradable interface layer 26. The first and second stack of green sheets 22 and 24, substantially correspond to the prior art stack of green sheets 10. They may be prepared individually, and then laminated with the intervening interface layer 26, or the entire assembly shown in FIG. 2 may be laminated in a single step to form the laminate 20.

In either case, the laminate 20 may subsequently be processed as described for the prior art laminate 10 by cutting the laminate into individual pieces followed by firing. The thermally degradable interface layer 26 degrades during the firing process to separate the upper stack of green sheets 22 from the lower stack 24 resulting in twice as many microelectronic ceramic substrates as would be processed using a prior art method.

Additional stacks of green sheets may also be laminated with corresponding intervening interface layers to increase the number of substrates produced during each firing cycle.

The present invention comprises a process for making multiple microelectronic ceramic substrates using the thermally degradable interface layer. The invention also comprises the microelectronic ceramic substrates manufactured according to the method of the invention. The thermally degradable interface layer 26 and the method of making the interface layer are further aspects of the present invention.

As will be understood from the description below, the presence of the interface layer 26 prevents debris from contaminating the surface of the second stack of green sheets 24. In another aspect of the invention (not shown), an additional interface layer may be placed on the upper surface of the green sheet stack 22. This additional interface layer will prevent debris contamination of the upper surface of green sheet stack 22 when the cutting is done before firing.

Figure 3:
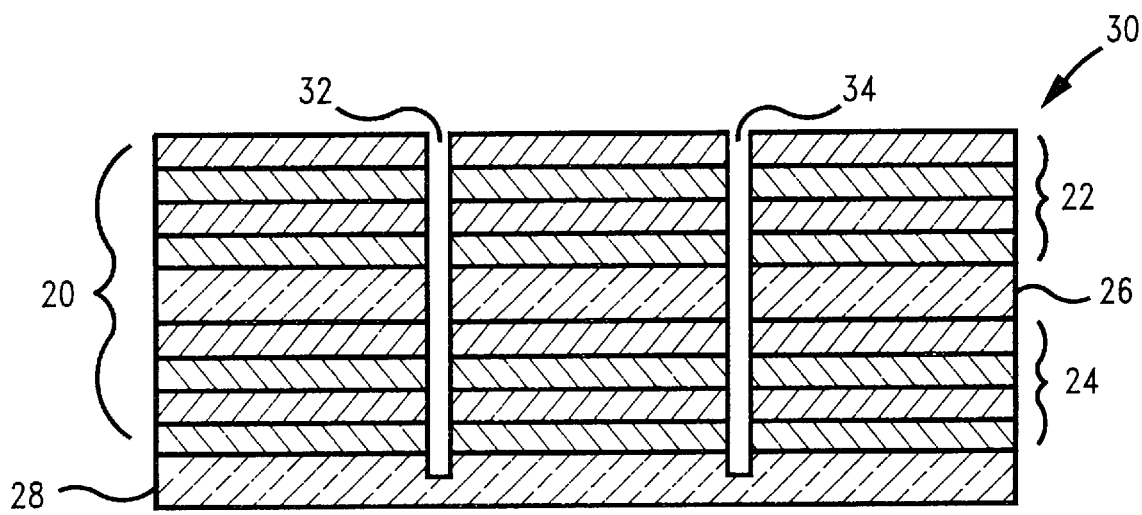
FIG. 3 is a cross-sectional side view of two laminated stacks of green sheets separated by an interface layer, and which are positioned on an interface layer, the laminate being partially cut apart into individual substrates according to the present invention.

FIG. 3 illustrates yet another use for the thermally degradable interface layer in which the laminate 20 from FIG. 2 has been provided with an additional thermally degradable interface layer 28 on its lower surface. The complete laminate 30 has been partially cut through as indicated by saw kerfs 32, 34. The saw kerfs extend through the green sheet stacks 22 and 24 as well as through the intervening interface layer 26, but only extend partially through the lower interface layer 28. This allows, the entire laminate 30 to be handled as a single unit instead of multiple pieces. During firing, the lower interface layer 28 and the upper interface layer 26 thermally degrade to release multiple individual ceramic substrates which are completely separated by the saw kerfs 32, 34.

The process for making the microelectronic ceramic substrates comprises stacking a first plurality of green sheets 22 over a separating thermally degradable interface layer 26 and a second plurality of green sheets 24. The assembly is then laminated, preferably under both heat and pressure to form the structure seen in FIG. 20. The laminating pressure is preferably greater than 3 megapascals (approximately 500 pounds per square inch) and most preferably within the range of 10–40 megapascals (approximately 1,500–6,000 psi). Lamination is preferably completed at a temperature above room temperature, most preferably at a temperature of between 35–100° C.

Following lamination, the laminate, which may be a laminate according to FIG. 2 or FIG. 3, is preferably cut into separated pieces or into the structure shown in FIG. 3. The laminate is then fired to degrade the interface layer and separate the first and second plurality of sintered green sheets into individual ceramic substrates.

The firing and sintering process may be varied as desired in accordance with the properties of the interface layer and the green sheets. For interface layers of the type described below, which comprise a binder and a separating material, it is preferred to initially fire the laminate at a low temperature to degrade the interface layer, particularly, the binder, and drive off any remaining solvents. This is then followed by raising the firing temperature to a higher temperature to sinter the green sheets and form the desired ceramic. The higher temperature also acts to degrade the separating material, and most preferably, to completely eliminate the separating material and any residue from the interface layer.

In the most highly preferred embodiment of the process, the firing is done in a reducing atmosphere such as hydrogen or cracked ammonia.

An interface layer suitable for use with the present invention is any sheet material which will thermally degrade during the firing process in a way which separates the green sheets without contaminating or otherwise adhering to their surfaces in a detrimental fashion. It is also desirable for the interface layer to permit the formation of the laminate composed of the multiple layers.

A particularly suitable interface layer is a layer composed of thermally degradable binder and a separating material. The binder acts to hold the separating material in sheet form for the lamination and all subsequent processing steps. During the initial low temperature firing, the binder is typically driven off leaving the separating material. The separating material must separate the upper and lower stacks of green sheets 22, 24 until they have sufficiently sintered and densified so that they will no longer adhere to one another.

The separating material preferably has the property of reacting either with the reducing atmosphere or residual oxygen so that it too is driven off or consumed leaving little or no residue which would contaminate the substrates.

In the preferred embodiment of the interface layer, the binder is a polymer, such as ethylcellulose or methylcellulose. The separating material is preferably an inorganic material. Two materials which have been successfully used as a separating material are boron nitride and graphite.

A Thermally Degradable Interface Layer and Method of Making the Same

The preferred interface layer for practicing the invention described above comprises: 1) a binder that thermally degrades at temperatures above room temperature and below a firing temperature for the microelectronic ceramic substrates, and 2) a separating material comprising a material that acts to separate the first and second layers of the microelectronic ceramic substrates during firing. The binder and separating material are preferably combined with an appropriate solvent (or solvents) and a plasticizer or other additive necessary to form the components into a sheet as needed for the interface laminating operation.

In the most highly preferred method of making the interface layer, a binder, a plasticizer, one or more solvents and the separating material are first obtained in the following ranges, by weight percentage:

| binder | 10–20% |
|---|---|
| plasticizer | 0–5% |
| solvent(s) | 10–80% |
| separating material | 2–25% |

The binder is most preferably provided in the range of 13–15% by weight, the plasticizer in the range of 0.5–1% by weight, the solvent(s) in the range of 16–80% by weight and the separating material in the range of 5–20% by weight.

The binder, solvent and plasticizer are combined in a container and mixed for a sufficient period of time to form a homogeneous mixture. The preferred binder is ethylcellulose or methylcellulose. The preferred plasticizer is dipropylene glycol dibenzoate. The preferred solvent is a mixture of two solvents, including methanol in the range of 16–20% and methyl isobutyl ketone in the range of 50–60% by weight.

The binder, solvent and plasticizer are mixed for a sufficient period of time to form a homogeneous mixture. The time needed may vary widely depending upon the mixing speed, temperature and composition of the initial components, but is typically complete within 24 hours.

The separating material is then added to the mixed binder, solvent and plasticizer and mixing is initiated again to form a homogeneous mass. The separating material most preferably comprises 5–20% of the composition by weight and the preferred materials are graphite or boron nitride, with boron nitride generally producing better results. The mixing time for, the separating material and the previously mixed binder, solvents and plasticizer also may vary widely. It is desired to form a castable homogeneous mass and this is typically accomplished within 24 hours of initiating the final mixing.

After final mixing, the material is cast on a carrier to form the desired sheet. The casting operation is most preferably done with the homogeneous mass above room temperature. In a typical casting step, a doctor blade caster is used with a polymer carrier 20 meters in length. The casting temperature is 40° C. and the doctor blade is set at a height of 400–500 micrometers above the carrier. This results in a interface layer having a thickness of from 50–100 micrometers.

After casting, the interface film is removed from the carrier and subsequently cut into the desired pieces to match the green sheets with which it will be laminated.

The initial firing temperature for removing the binder is typically below 800° C. The higher temperature which results in densification and sintering of the ceramic is typically between 1500–1600° C. Most preferably, the two steps of firing are done in one continuous cycle with the rate of temperature increase being controlled to provide the proper duration of firing at the lower and higher temperatures to drive off the binder, then consume the separating material.

Although not wishing to be bound by any particular theory of operation, it is believed that the boron nitride separating material is consumed by the reducing atmosphere whereas the graphite reacts with residual oxygen. In both cases, the separating material is substantially consumed leaving the sintered ceramic substrates free and separated.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An interface layer for separating first and second microelectronic ceramic substrates during firing comprising:
   a binder in an amount of about 10–20% by weight comprising a material that thermally degrades at temperatures above room temperature and below a firing temperature for the microelectronic ceramic substrates;
   a separating material in an amount of about 2–25% by weight comprising a material that acts to separate the first and second microelectronic ceramic substrates during firing and which is consumed during firing of the substrate; and
   a sufficiently low quantity of a solvent for the binder remaining in the interface layer when the interface layer is ready for use to allow the interface layer to form a non-liquid unitary sheet the solvent being in an amount of about 10–80% by weight;
   the binder, solvent and separating material forming the non-liquid sheet as a movable and positionable integral unit for lamination between the first and second microelectronic ceramic substrates, and the interface layer thermally degrading and being consumed during firing to separate the first and second microelectronic ceramic substrates.

2. An interface layer for separating first and second microelectronic ceramic substrates according to claim 1 wherein the binder is a thermally degradable polymer.

3. An interface layer for separating first and second microelectronic ceramic substrates according to claim 2 wherein the binder is ethylcellulose or methylcellulose.

4. An interface layer for separating first and second microelectronic ceramic substrates according to claim 1 wherein the separating material is an inorganic material.

5. An interface layer for separating first and second microelectronic ceramic substrates according to claim 4 wherein the inorganic material is boron nitride.

6. An interface layer for separating first and second microelectronic ceramic substrates according to claim 4 wherein the inorganic material is graphite.

7. An interface layer for separating first and second microelectronic ceramic substrates according to claim 1 wherein the separating material is mixed with the binder after the binder is dissolved in the solvent, the binder being thoroughly mixed with and dissolved in the solvent to form homogenous mass before the separating material is mixed with the binder.

8. An interface layer for separating first and second microelectronic ceramic substrates according to claim 1 wherein the solvent includes methanol.

9. An interface layer for separating first and second microelectronic ceramic substrates according to claim 1 wherein the solvent includes methyl isobutyl ketone.

10. An interface layer for separating first and second microelectronic ceramic substrates according to claim 1 wherein the solvent includes a mixture of methyl isobutyl ketone and methanol.

11. An interface layer for separating first and second microelectronic ceramic substrates according to claim 1 wherein the interface layer further includes a plasticizer being present in an amount up to about 5% by weight.

12. An interface layer for separating first and second microelectronic ceramic substrates according to claim 11 wherein the plasticizer comprises dipropylene glycol dibenzoate.

* * * * *